United States Patent [19]

Needham et al.

[11] Patent Number: 5,140,396

[45] Date of Patent: Aug. 18, 1992

[54] FILTER AND SOLID STATE IMAGER INCORPORATING THIS FILTER

[75] Inventors: Christopher R. Needham, Beverly; Carl A. Chiulli, Randolph; Stephen F. Clark, North Andover, all of Mass.

[73] Assignee: Polaroid Corporation, Cambridge, Mass.

[21] Appl. No.: 715,100

[22] Filed: Jun. 13, 1991

Related U.S. Application Data

[62] Division of Ser. No. 595,211, Oct. 10, 1990, Pat. No. 5,059,500.

[51] Int. Cl.$^5$ .............................................. H01L 27/14
[52] U.S. Cl. ........................................ 357/30; 357/24; 357/8; 430/293; 430/7; 430/245; 250/226; 359/891
[58] Field of Search ............... 357/30 G, 30 H, 30 L, 357/30 P, 24 LR, 32, 8; 250/226; 350/311; 430/293, 7, 321, 322, 394, 245, 570, 571; 359/885, 891

[56] References Cited

U.S. PATENT DOCUMENTS

| | | | |
|---|---|---|---|
| 3,873,361 | 3/1975 | Franco et al. | 117/212 |
| 4,239,842 | 12/1980 | Sandhu | 430/7 |
| 4,256,816 | 3/1981 | Dunkleberger | 430/11 |
| 4,357,415 | 11/1982 | Hartman | 430/293 |
| 4,357,416 | 11/1982 | Fan | 430/302 |
| 4,387,145 | 6/1983 | Lehrer et al. | 430/5 |
| 4,397,928 | 8/1983 | Sato et al. | 430/7 |
| 4,400,454 | 8/1983 | Sato et al. | 430/7 |
| 4,419,425 | 12/1983 | Ogawa et al. | 430/7 |
| 4,425,416 | 1/1984 | Ogawa | 430/7 |
| 4,428,796 | 1/1984 | Milgram | 156/637 |
| 4,450,215 | 5/1984 | Reithel et al. | 430/7 |
| 4,565,756 | 1/1986 | Needs et al. | 357/24 LR X |
| 4,609,614 | 9/1986 | Pampalone et al. | 430/312 |
| 4,613,398 | 9/1986 | Chlong et al. | 156/628 |
| 4,808,501 | 2/1989 | Chiulli | 430/7 |
| 4,876,167 | 10/1989 | Snow et al. | 357/30 L X |
| 4,891,303 | 1/1990 | Garza et al. | 430/312 |

FOREIGN PATENT DOCUMENTS

| | | | |
|---|---|---|---|
| 56-2675 | 1/1981 | Japan | 357/24 LR |
| 57-4012 | 9/1982 | Japan . | |
| 59-61066 | 4/1984 | Japan | 357/30 L |

OTHER PUBLICATIONS

O'Toole et al., "Multilevel resist for photolithography utilizing an absorbing dye; simulation and experiment", The International Society for Optical Engineering (SPIE), vol. 275, Semiconductor Microlithography VI (1981), pp. 128-135.

Paraszczak et al., "Chemical and physical aspects of multilayer resist processing", SPIE, vol. 920, Advances in Resist Technology and Processing V (1988), pp. 242-243.

Underhill et al., "Silicon oxynitride as a barrier layer in a 3-layer photoresist system", SPIE, vol. 539, Advances in Resist Technology and Processing II (1985), pp. 83-89.

*Primary Examiner*—William Mintel
*Attorney, Agent, or Firm*—David J. Cole

[57] ABSTRACT

A filter is formed on a substrate, such as a solid state imager, by providing successively on the substrate a layer of an absorber material, a layer of a barrier material, and a layer of a photoresist material. The photoresist is patternwise exposed and developed, thereby baring regions of the barrier layer underlying selected regions of the photoresist layer. The coated substrate is reactive ion etched under a first set of etching conditions to etch away the bared regions of the barrier layer and to bare but not substantially etch the underlying regions of the absorber layer, and then reactive ion etched under a second set of etching conditions, thereby etching away the remaining regions of the photoresist layer and the bared regions of the absorber layer, so forming a filter on the substrate. To form multi-colored filters, the process may be repeated with a different dye, or additional dyes may be deposited by other processes, such as that described in U.S. Pat. No. 4,808,501.

20 Claims, 3 Drawing Sheets

FILTER AND SOLID STATE IMAGER INCORPORATING THIS FILTER

This application is a divisional of application Ser. No. 07/595,211 filed Oct. 10, 1990 (now U.S. Pat. No. 5,059,500, issued Oct. 22, 1991).

BACKGROUND OF THE INVENTION

This invention relates to a filter, a process for forming this filter, and a solid state imager provided with this filter. This invention is especially directed to color filters.

To obtain color image recording using solid state imagers such as charge coupled devices, optical filters in a multicolor stripe or mosaic form are employed; in many cases, these filters are formed directly upon the photosensitive surface of the solid state imager. Such filters are normally provided with elements having two or three differing colors. (The term "having color" is used herein to mean "transmitting electromagnetic radiation of a particular wavelength", and does not necessarily refer to visible radiation. Thus, a three color filter of this invention may have elements which transmit three differing wavelengths of ultraviolet radiation, all of which are invisible to the human eye.) For example, a two color filter may have yellow and cyan elements which overlap in part, the overlap area providing, in effect, a green element. A three color filter will typically have red, green and blue, or cyan, yellow and magenta elements.

A number of processes are described in the art for preparing such filters. For example, U.S. Pat. No. 4,239,842, issued Dec. 16, 1980, describes a process for producing a color filter array by depositing successively on a semi-conductive layer, such as a charge coupled device, a sub-coat, a polymeric mordant, and a photoresist. The photoresist layer is exposed and developed to form a mask, and dye is then heat-transferred through the apertures in the photoresist into the polymeric mordant. Finally, the photoresist is stripped.

U.S. Pat. No. 4,565,756, issued Jan. 21, 1986, describes a color filter formed by laying on a substrate a transparent layer, forming by photolithography a pattern of filter elements separated by separation regions (grooves or dye-impermeable regions) in the transparent layer, laying a barrier layer over the transparent layer, forming by photolithography a pattern of apertures in the barrier layer, this pattern of apertures corresponding to the location of a first system of filter elements, dyeing the first system of filter elements through these apertures, and finally removing the barrier layer. The formation of the barrier layer and the subsequent steps of the process are then repeated for other colors.

A variety of techniques have also been developed for producing the fine lines and other image elements needed in the production of integrated electrical circuits and in lithography. For example, U.S. Pat. No. 3,873,361, issued Mar. 25, 1975, describes a process for producing thin films for integrated circuits by depositing a) a photoresist (polymeric) layer which is baked to render it non-photosensitive; b) a metallic layer; c) a second photoresist layer, then exposing and developing the second photoresist layer to form a mask, etching the exposed metallic layer through this mask, using the metallic mask so produced to remove exposed polymeric layer, preferably by sputter etching, depositing a metallic film in areas where the bottom polymeric layer has been removed, and finally removing, by conventional lift-off solvent methods, the remaining parts of the metallic layer and the bottom polymeric layer.

U.S. Pat. No. 4,428,796, issued Jan. 31, 1984, describes the production of integrated circuits by coating a silicon substrate with layers of polyimide material, silicon dioxide and positive photoresist. The photoresist is exposed and developed. Using plasma or reactive ion etching, the silicon dioxide is etched away where the photoresist has been removed. A different plasma is then used to etch the polyimide where the silicon dioxide has been removed. A desired (typically electrically conductive) material is placed on the substrate so that discrete portions of the desired material are formed in the holes in the polyimide layer and on top of the silicon dioxide layer (the photoresist layer disappears during the second etching). The remaining parts of the polyimide layer, together with the overlying silicon dioxide and desired material layers, are then stripped away by heating, treatment with solvent, and ultrasonification.

U.S. Pat. No. 4,891,303, issued Jan. 2, 1990 on application Ser. No. 07/199,087, filed May 26, 1988, describes a method for patterning an integrated circuit workpiece including forming a first layer of organic material on the workpiece surface to a depth sufficient to allow a substantially planar outer surface thereof. A second, polysilane-based resist layer is spin-deposited on the first layer. A third resolution layer is deposited on the second layer. The resolution layer is selectively exposed and developed using standard techniques. The pattern in the resolution layer is transferred to the polysilane layer by either using exposure to deep ultraviolet or by a fluorine-base reactive ion etching (RIE) etch. This is followed by an oxygen-based RIE etch to transfer the pattern to the surface of the workpiece.

Similar three-layer photoresist systems are described in O'Toole et al., Multilevel resist for photolithography utilizing an absorbing dye; simulation and experiment, The International Society for Optical Engineering (SPIE), volume 275, Semiconductor Microlithography VI (1981) (which discusses the use of such systems in the production of integrated circuits); in Paraszczak et al., Chemical and physical aspects of multilayer resist processing, SPIE Volume 920, Advances in Resist Technology and Processing V (1988); and in Underhill et al., Silicon oxynitride as a barrier layer in a 3-layer photoresist system, SPIE Volume 539, Advances in Resist Technology and Processing II (1985).

U.S. Pat. No. 4,808,501, issued Feb. 28, 1989 and assigned to the same assignee as the present application, describes a process for forming a color filter on a support, such as a charge coupled device, by (a) forming a layer on a support with a composition comprising a positive photoresist and a dye, the dye being soluble in the solvent of the photoresist; (b) exposing predetermined portions of the layer to radiation adapted to increase the solubility of the coating in the exposed areas; (c) developing the exposed areas to form a pattern of filter elements; and (d) repeating these steps with a different color dye in the composition; wherein the dye constitutes in excess of 10% by weight, dry basis of the composition, is substantially non-absorptive in the exposure wavelength of the composition, and provides predetermined absorptive characteristics for the specified filter element and the dye possesses substantially the same polarity as the composition.

The process described in U.S. Pat. No. 4,808,501 gives excellent results. However, this process does require that the dye be substantially non-absorptive in the exposure wavelength of the composition, and this creates difficulties in forming a yellow filter element with some commercial photoresists. Many commercial Novolak photoresists are designed for exposure using the g-line of a mercury lamp at 436 nm., and yellow dyes tend to absorb this line strongly. Thus, these yellow dyes, when used at the very high concentrations required in the process of U.S. Pat. No. 4,808,501, require very long exposure times, since the high concentration of yellow dye in the photoresist absorbs much of the 436 nm. light used to expose the photoresist.

The present invention provides a process for forming a filter on a substrate which does not require the use of a dye suitable for incorporation in a photoresist composition, and which can thus be used with dyes which absorb strongly at the exposure wavelength of a photoresist, or which chemically disrupt a Novolak positive process. The present process can be used alone to form multicolored filters, or filter elements of one color can be formed by the present process and filter elements of one or more other colors can thereafter be formed using the process of U.S. Pat. No. 4,808,501. The present process is especially useful for forming a filter element directly on a solid state imager, since it does not require any conditions detrimental to a solid state imager. The present invention is also capable of providing filters of high quality in which the filter elements are accurately aligned with the photosensitive elements of the solid state imager, and in which there is little or no undesired overlap between filter elements of differing colors.

SUMMARY OF THE INVENTION

The present invention provides a process for forming a filter on a substrate, which process comprises:

providing on the substrate a layer of an absorber material having predetermined absorption and transmission characteristics;

providing a layer of a barrier material superposed on the layer of absorber material, the barrier material being more susceptible to reactive ion etching than the absorber material under a first set of etching conditions, but resistant to reactive ion etching under a second set of etching conditions under which the absorber material is susceptible to etching;

providing a layer of a photoresist material superposed on the layer of barrier material;

patternwise exposing the layer of photoresist material and developing the exposed layer to remove either the exposed or non-exposed regions thereof, thereby to bare regions of regions of the barrier layer underlying the removed regions of the photoresist material, the remaining regions of the photoresist material being resistant to reactive ion etching under said first set of etching conditions but susceptible to reactive ion etching under said second set of etching conditions;

reactive ion etching the coated substrate under said first set of etching conditions, thereby etching away the bared regions of the barrier layer and baring selected regions parts of the absorber layer, but not etching away the remaining regions of the photoresist material nor substantially etching away the bared regions of the absorber layer; and reactive ion etching the coated substrate under said second set of etching conditions, thereby etching away the remaining regions of the photoresist layer and the bared regions of the absorber layer, and thereby forming a filter on the substrate.

The steps of the present process may be repeated one or more times to produce a filter having discrete areas of at least two colors. Alternatively, filter elements of one color (preferably yellow) may be formed by the present process, and the filter thus formed treated by a method comprising the steps of:

providing on the filter a layer of a dye/photoresist composition comprising a positive photoresist and a second dye, the second dye having absorption characteristics differing from those of the absorber material and being soluble in the solvent of the positive photoresist; and patternwise exposing the second dye/photoresist layer and developing the exposed layer with a developer for the photoresist to remove the exposed regions of the exposed layer, the second dye constituting in excess of 10 percent by weight of the second dye/photoresist composition, being substantially non-absorptive in the exposure wavelength of the second dye/photoresist composition and possessing substantially the same polarity as the composition, thereby producing a filter having discrete areas of at least two differing colors.

This variant of the process, in which a first color is deposited by the reactive ion etch process of the present invention and thereafter one or more other dyes of different color(s) are deposited by the process described in the aforementioned U.S. Pat. No. 4,808,501, will hereinafter to referred to as the "hybrid process" of the present invention.

Finally, this invention provides a color filter comprising:

a plurality of first areas comprising a first dye, and a barrier layer superposed over the first dye, the barrier layer comprising a silicon rich species and being resistant to oxygen reactive ion etching but readily etched by fluorine containing plasmas; and a plurality of second areas comprising a second dye having absorption characteristics differing from those of the first dye, at least one of the second areas overlapping at least one of the first areas to form at least one overlap area in which the first and second dyes are separated by the barrier layer.

DETAILED DESCRIPTION OF THE INVENTION

Figure 1A:
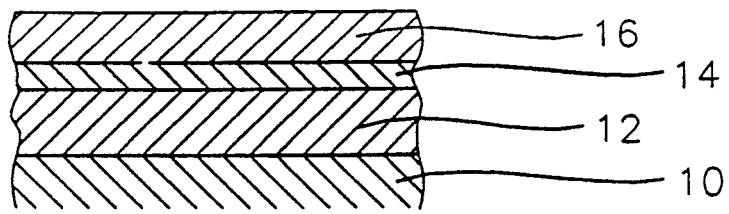
FIG. 1A of the accompanying drawings shows schematically in cross-section a stage in a preferred process of the present invention following deposition of the absorber material, barrier material and photoresist material on a substrate.

As already mentioned, in the process of the present invention a filter is formed upon a substrate by providing upon the substrate successive layers of an absorber material, a barrier material and a photoresist material; the photoresist may be a positive or negative photoresist. The photoresist is patternwise exposed and the exposed layer developed to remove either the exposed or non-exposed regions thereof, thereby baring the regions of the barrier layer underlying the removed regions of the photoresist material. The absorber material, barrier material and photoresist are chosen so that the absorber material and the regions of the photoresist remaining after development are resistant to reactive ion etching under a first set of etching conditions but susceptible to reactive ion etching under a second set of etching conditions, whereas the barrier material is susceptible to reactive ion etching under the first set of etching conditions but resistant to reactive ion etching under the second set of etching conditions. A first reactive ion etching is then performed under the first set of etching conditions and covering the whole area of the filter to be produced, thereby remove the bared regions of the barrier layer and baring but not substantially etching the underlying parts of the absorber layer. A second reactive ion etching (or combination of ion etching steps) then removes the remaining regions of the photoresist material and the bared regions of the absorber layer, thereby forming a filter on the substrate.

During the first reactive ion etching step of the present process some etching of the bared regions of the absorber layer can be tolerated, provided that this etching of the absorber layer is not so great as to affect the desired absorption/transmission characteristics of the absorber layer in the final filter. In practice, it has been found that the present process can be practiced satisfactorily using a first set of etching conditions which etch the barrier material only about 1.5 times as fast as the absorber material. In contrast, a considerable greater ratio between the rates of etching of the absorber material and the barrier material is required in the second reactive ion etching step, since it is essential to remove all of the bared regions of the absorber layer without any risk of creating perforations in the regions of the barrier layer which are to remain in the final filter; in practice, the barrier layer is usually thinner than the absorber layer.

The substrate used in the present process can be simply a carrier for the filter; for example, the substrate could be a plastic sheet on which the filter is formed so that the filter can be handled readily and placed in its final location. However, the present process is especially suitable for formation of a filter in situ on the photosensitive surface of a solid state imager, and thus the substrate used in the process is desirably a solid state imager, preferably a charge coupled device, charge injection device or photodiode array.

The absorber material used in the present process may be any of the absorber materials known in the art, provided that it will adhere to the underlying substrate and is resistant to reactive ion etching under the first set of etching conditions but susceptible to reactive ion etching under the second set of etching conditions. Desirably, the absorber material is essentially free from metal ions, since metal ions usually produce, during ion etching, an undesirable ash which may adhere to the substrate and interfere with light transmission through the filter.

Typically, the absorber material will comprise a polymer having a dye material therein. (The term "dye" is used herein to mean any material which when applied to an appropriate substrate produces a change in the electromagnetic radiation received by that substrate through a layer containing the dye. Thus, in addition to dyes which are inherently colored compounds as perceived by the human eye, the term "dye" as used herein includes materials which change only the non-visible electromagnetic radiation received by the substrate, for example, materials which absorb in the infra-red or ultraviolet regions). The polymer may be any filmforming polymer having the appropriate reactive ion etch characteristics, for example a polyester, a polyamide or a Novolak resin. The absorber material will typically be applied from solution and solutions of polyester resins suitable for admixture with dyes and subsequent application to form the absorber material in the present process are available commercially; for example the material sold by Futurrex, of 44–50, Clinton Street, Newton, N.J. 07860, under the tradename Futurrex PC1-1500D has been found to give good results in the present process. The solution of the absorber material may be coated onto the substrate by dipping, spraying, spin coating, or other methods conventional in the art. The coating is dried by removal of the solvent, whereupon good adhesion of the entire coating to the substrate is obtained.

The thickness of the absorber layer will of course vary with the extinction coefficient of the dye used, the proportion of dye present and the optical density desired in the filter, but it general the absorber layer desirably has a thickness in the range of about 1 to about 5 microns, preferably about 2 to about 3 microns. Excessively thick absorber layers should be avoided, at least in filters formed on solid state imagers, since oblique transmission of light through such thick absorber layers may degrade the resolution of the solid state imager.

The dye used in the absorber material may be any of those known in the art for forming color filters; metal-free solvent dyes are preferred, although other dyes may also be used. The dye must of course be compatible with the polymer so that the dye will not crystallize out, agglomerate or otherwise render the absorber material heterogeneous, either during formation of the filter or later. Also, the absorber material must be such that it is resistant to a reactive ion etch which etches the barrier material, so that, in the first reactive ion etching step of the present process, the bared portions of the barrier layer can be etched away without removing the underlying absorber material. Most organic polymers fulfil this requirement.

As already noted, the present process is especially useful with blue light absorbing yellow, green or red dyes, since it permits exposure of the photoresist material with the conventional 436 nm. light without absorption of this light by the yellow dye.

As in prior art processes, after the substrate has been coated with the absorber material, it will usually be necessary or desirable to stabilize the absorber layer before forming the barrier layer thereon. Such stabilization may be effected by heat curing (typically by baking the absorber material at 200° C. or above), or by cross-linking (in which typically an ultraviolet curable resin is used in the absorber material and after the substrate has been coated the absorber material is baked at 200° C. or above, and then flood exposed with ultraviolet radiation to crosslink the polymer).

The barrier material used in the present process may be any of the conventional barrier materials (sometimes referred to as "intermediate coatings") known in the art, as described, for example, in the O'Toole, Paraszczak and Underhill papers mentioned above. Preferably the barrier material is silicon-based, since such silicon-based materials are readily etched by a fluorine-containing etchant which does not readily etch an organic absorber material. Suitable silicon-based materials include polysilanes, polysiloxanes, organosilicon compounds, silica, silicon nitride and mixtures thereof. Such silicon-based materials are available commercially; for example the material sold by Futurrex, of 44-50, Clinton Street, Newton, N.J. 07860, under the tradename Futurrex IC1-200, which comprises a silicon-based material in a solvent, has been found to give good results in the present process.

The barrier layer desirably has a thickness in the range of from about 0.2 to about 1 micron; below about 0.2 micron, it is difficult to ensure uniform coating, while too thick a barrier layer may require a lengthy first reactive ion etching step. The barrier material may be deposited by conventional techniques, for example plasma deposition or wet spin coating. Removal of solvent from the barrier layer is normally effected by baking; for example, a single bake at 200° C. for 15 minutes in a convection air oven or 200° C. for 30 seconds on a hot chuck is recommended for Futurrex IC1-200.

The photoresist material used in the present process is desirably a positive photoresist, since, at the small line or dot pitches required for forming filters on solid state imagers, negative photoresists are susceptible to problems caused by swelling of the photoresist. The term "positive photoresist" is used herein to refer to a composition which, in its dried-down state, when exposed to appropriate wavelength radiation is rendered more soluble in a developer composition than the unexposed areas, in contrast to a negative photoresist which is inherently soluble in a developer composition and which is cross-linked or hardened by exposure to render it less soluble in the exposed areas. Positive photoresist compositions are generally phenolic-formaldehyde Novolak resins employed in conjunction with a sensitizer or photoactive compound which is usually a substituted naphthoquinone diazide compound. The naphthoquinone sensitizer acts as a dissolution rate inhibitor with respect to the Novolak resin in aqueous alkaline solution. However, upon exposure to radiation, the sensitizer, which is a hydrophobic material, undergoes a structural transformation which converts its functionality as a dissolution rate inhibitor for the resin to a dissolution rate accelerator for the exposed area of the photoresist.

In the present invention, the level of photoactive compound is not critical. The specific amount of photoactive compound is selected with regard to speed or contrast desired. The specific positive photoresist is not critical, and commercially available photoresists may be conveniently employed. A conventional resin/photoactive compound composition would consist of about 80-85% by weight, dry basis, of resin and 15-20% by weight, dry basis, of photoactive compound wherein the two components are mixed or chemically bonded together. Other conventional additives may optionally be employed in the photoresist composition, including plasticizers, adhesion promoters, surfactants and the like. Examples of commercial photoresist materials which may be employed in the present process include Olin Hunt Specialty Products, Waycoat HPR 204 positive photoresist and Shipley Corporation System 8 photoresist.

The terms "developer" and "developing" are used herein to refer to compositions and process steps conventional in the photoresist art which remove the more soluble regions of the exposed photoresist layer (the exposed regions in the case of a positive photoresist, the unexposed regions in the case of a negative photoresist). Generally, the developer for a positive photoresist is an aqueous alkaline solution, such as sodium hydroxide, or other alkali metal or quaternary ammonium hydroxide solution.

The photoresist used in the present process must e chosen so that, after development, the remaining regions of the photoresist material are resistant to reactive ion etching under the first set of etching conditions but susceptible to reactive ion etching under the second set of etching conditions.

After the required regions of the photoresist layer have been removed, thereby baring the regions of the barrier layer underlying the removed regions of the photoresist, the whole of the coated substrate is subjected to a reactive ion etch under the first set of etching conditions. This first etching step removes the bared regions of the barrier layer but does not remove the underlying regions of the absorber layer. In order to ensure that the regions of the barrier layer removed by this etching step accurately conform to the previously-removed regions of the photoresist layer, it is preferred that the etch be effected using a low pressure directional plasma etch, which should be effected in a direction substantially normal to the plane of the substrate. When a silicon-based barrier material is used, the first set of etching conditions desirably include the use of a fluorine-based etching material, preferably sulfur hexafluoride or nitrogen trifluoride. The etching temperature, pressure etc. and apparatus used are those conventional in the art, and when a commercial barrier material, such as the aforementioned Futurrex IC1-200 is employed, the manufacturer will normally describe the etching conditions required for optimum performance.

After the bared regions of the barrier layer have been removed by the first etching step, the whole of the coated substrate is subjected to a second etching step under the second set of etching conditions to remove the regions of the photoresist layer not removed during the first etching step, and also to remove the regions of the absorber layer bared during the first etching step. Although in theory these two removal operations could be performed separately, in practice it is convenient to remove both in a single operation, since most photoresists and most absorber materials are both based upon organic polymers and are thus susceptible to etching with the same type of etching materials. When organic photoresists and absorber materials are used, the second set of etching conditions desirably includes the use of oxygen. For reasons similar to those of the first etching step, as discussed above, the second etching step is desirably a low pressure directional plasma etch.

As already mentioned, following the formation of a single-color filter by the present process, one or more additional colors may be deposited either by repeating the steps of the present process with an absorber material containing a different dye, or by using the process of U.S. pat. No. 4,808,501. When the latter approach is employed, preferably a yellow dye is used in the present process and either cyan, or cyan and magenta, dye(s) are deposited by the process of U.S. pat. No. 4,808,501. When only yellow and cyan dyes are used, the areas covered by these dyes preferably overlap, so effectively producing a three-color filter using only two dyes.

The present invention thus provides a process for producing a filter which can make use of dyes which absorb strongly at the exposure wavelength of the photoresist, which can produce high quality filters and which makes use of readily available materials.

Preferred embodiments of the invention will now be described, though by way of illustration only, with reference to the accompanying drawings, to show details of preferred materials, conditions and techniques used in the present invention.

FIGS. 1A–1D of the accompanying drawings are schematic cross-sections at various stages in a process of the present invention which forms a single color filter on a substrate 10, namely a solid state imager. To create the structure shown in FIG. 1A, an absorber layer 12 is formed by coating the substrate 10 with an absorber material which contains a yellow dye. Next, a barrier layer 14 of barrier material is coated superposed above the absorber layer 12. Finally, a photoresist layer 16 formed of positive photoresist is coated superposed above the barrier layer 14.

Figure 1B:
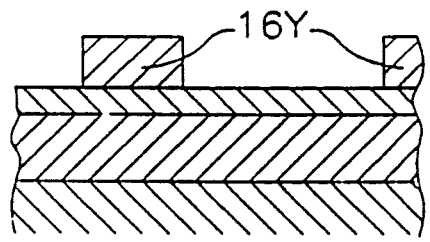
FIG. 1B is a section similar to FIG. 1A but showing the same process following exposure and development of the photoresist material.

The photoresist is now patternwise exposed and developed in the conventional manner to remove the exposed regions thereof and produce "islands" 16Y of photoresist (as shown in FIG. 1B) separated by regions from which the photoresist has been removed. The islands 16Y correspond in size and shape to the regions in which the yellow dye will be present in the final filter, and may thus be in the form of elongate strips if a filter having parallel stripes of differing colors is required, or in the form of isolated dots if a filter having a matrix of dots of differing colors is required. The process shown in FIGS. 1A–1D is intended for the preparation of a three-color filter having parallel stripes of differing colors, and thus the islands 16Y are in the form of elongate strips extending perpendicular to the plane of FIG. 1B, and separated by regions twice as wide as the individual strips 16Y. The removal of the exposed regions of the photoresist bares the underlying regions of the barrier layer 14.

Figure 1C:
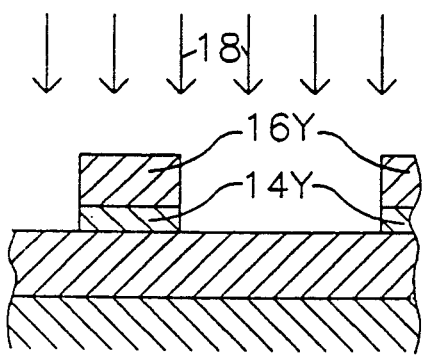
FIG. 1C is a section similar to FIG. 1A but showing the same process following the first reactive ion etch.

Next, as indicated by the arrows 18 in FIG. 1C, the coated solid state imager 10 is subjected to a first low pressure directional plasma etch directed normal to the plane of the solid state imager using a first set of etching conditions which etch the bared regions of the barrier layer 14 where the overlying photoresist layer has been removed, but which do not substantially etch the underlying absorber layer 12 or the islands 16Y of photoresist. At the conclusion of this first etching step, islands 14Y of barrier material are formed underlying the islands 16Y of photoresist, and the remaining parts of the barrier layer have been removed, thereby baring the underlying parts of the absorber layer 12.

Figure 1D:
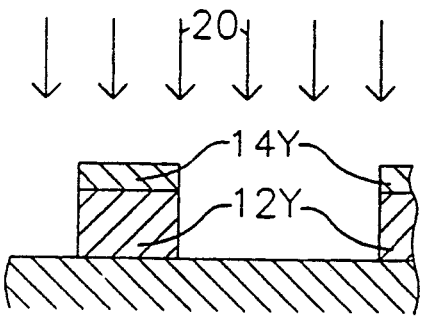
FIG. 1D is a section similar to FIG. 1A but showing the same process following the second reactive ion etch, with a completed single-color filter formed on the substrate.

After the first etching step, the coated solid state imager 10 is subjected to a second low pressure directional plasma etch. Again, the etch is directed normal to the plane of the solid state imager, as indicated by the arrows 20 in FIG. 1D, but using a second set of etching conditions which etch the bared regions of the absorber layer 12, and the remaining islands 16Y of photoresist. The resultant structure, as shown in FIG. 1D, is a completed single-color filter having islands 12Y of the yellow absorber material overlain by the islands 14Y of barrier material.

Figure 2A:
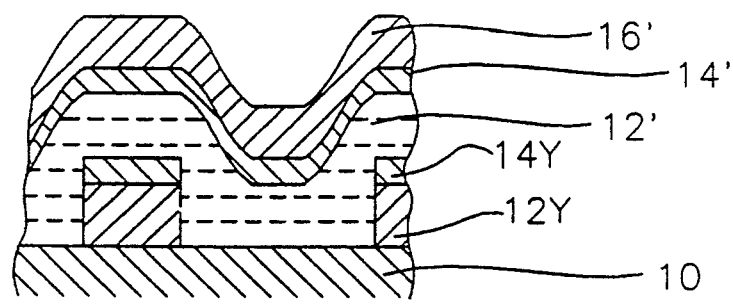
FIGS. 2A-2D shows sections similar to those of FIGS. 1A-1D respectively, but in a process in which a second color is added to the filter shown in FIG. 1D using the reactive ion etch method of the present invention.

The single-color (yellow) filter produced in this manner may be modified to produce a multi-color filter using the reactive ion etching process of the present invention as shown in FIGS. 2A–2D. As shown in FIG. 2A, on the filter shown in FIG. 1D is deposited a second absorber layer 12' containing a dye having a color different from the yellow dye in absorber layer 12; for purposes of illustration, it will be assumed that the second absorber layer 12' contains a cyan dye. On top of the cyan absorber layer 12' are coated a barrier layer 14' and a photoresist layer 16', these layers being of the same composition as the layers 14 and 16 respectively shown in FIG. 1A.

Figure 2B:
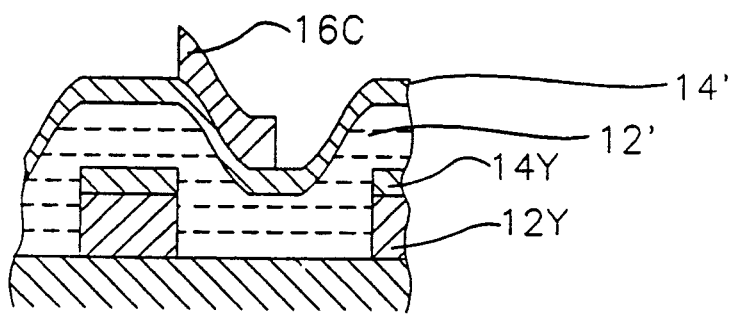
Figure 2C:
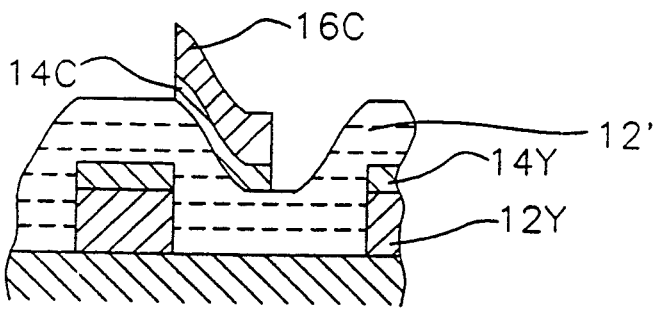
Figure 2D:
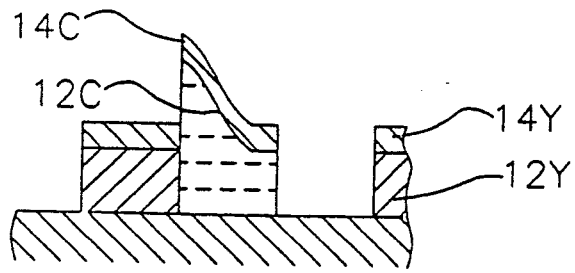

The photoresist layer 16' is exposed and developed to produce the structure shown in FIG. 2B, in which islands 16C of photoresist remain, these islands 16C being displaced laterally from the islands 12Y of yellow absorber material, and occupying half the gaps between adjacent islands 12Y. A first reactive ion etching step yields the structure shown in FIG. 2C, in which the bared portions of the barrier layer 14' have been removed to leave islands 14C of barrier material below the islands 16C of photoresist; note that the islands 14Y of barrier material produced during the production of the yellow filter elements are not removed, since these islands 14Y are covered by the cyan absorber layer 12', which is not attacked in the first etching step. Finally, a second reactive ion etching step yields the structure shown in FIG. 2D, in which islands 12C of cyan absorber material are present extending parallel to the islands 12Y of yellow absorber material and capped by islands 14C of barrier material. The original yellow filter elements comprising the islands 12Y of absorber material and 14Y of barrier material are unaffected by the formation of the parallel cyan filter elements.

Figure 3:
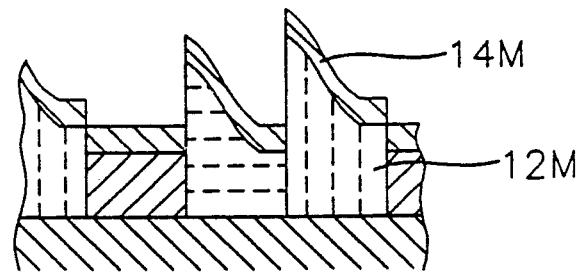
FIG. 3 shows a section similar to that of FIG. 2D through a three-color filter produced using the reactive ion etch method of the present invention.

It will readily be apparent that, by repeating the steps of the present process once more, magenta filter elements comprising islands 12M of magenta absorber material capped by islands 14M of barrier material can be formed in the gaps between the yellow and cyan filter elements, as shown in FIG. 3.

Figure 4A:
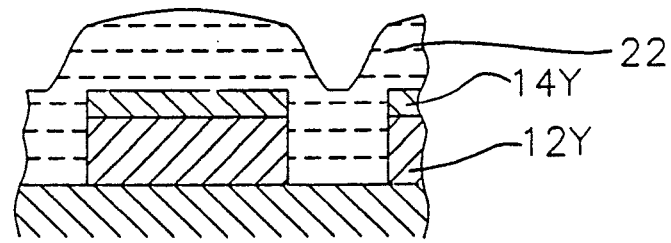
FIGS. 4A and 4B show sections similar to those of FIGS. 2A and 2D respectively for a process in which a second color is added to the filter shown in FIG. 1D using the hybrid method of the present invention.
Figure 4B:
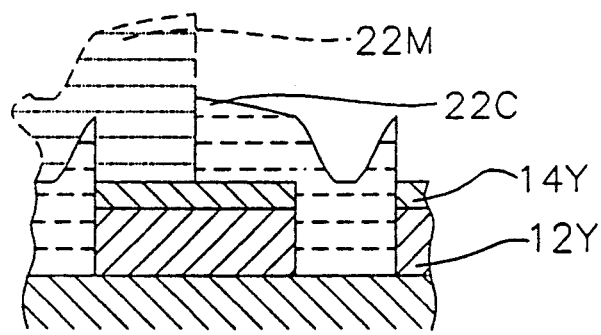

FIGS. 4A and 4B illustrate one way in which a second set of filter elements may be added to a single-color filter similar to that produced in FIG. 1D using the process of the aforementioned U.S. Pat. No. 4,808,501. In this embodiment, as shown in FIG. 4A, the islands 12Y of yellow absorber material are made wider than those shown in FIG. 1D so that these islands are twice as wide as the intervening gaps. A composition comprising a cyan dye in a positive photoresist is then applied over the whole surface of the solid state imager 10 to produce a photoresist/dye layer 22, as shown in FIG. 4A. This photoresist/dye layer 22 is exposed and developed to produce cyan filter elements 22C shown in FIG. 4B. As shown in that Figure, the cyan filter elements 22C partially overlap the islands 12Y of yellow absorber material thereby effectively forming a three-color filter, the three colors being yellow where the islands 12Y are not overlapped by the cyan filter elements 22C, cyan where the cyan filter elements 22C do not overlap the islands 12Y, and green where the cyan filter elements 22C do overlie the islands 12Y. Where the cyan filter elements 22C do overlap the islands 12Y, the yellow and cyan dye layers are separated by the islands 14Y of barrier material.

If a red-green-blue filter is desired the filter shown in FIG. 4B may be modified by the deposition, by the process of the aforementioned U.S. Pat. No. 4,808,501, of magenta filter elements 22M, as shown in broken lines in FIG. 4B, these magenta filter elements 22M overlapping both the yellow islands 12Y and the cyan filter elements 22C. The resultant filter has green filter elements where the cyan elements 22C overlap the yellow islands 12Y, blue elements where the magenta elements 22M overlap the cyan elements 22C, and red elements where the magenta elements 22M overlap the yellow islands 12Y.

EXAMPLE

This Example illustrates one way in which a single color filter could be prepared by a process of the present invention.

A charge coupled device is coated with Futurrex PC1-1500D absorber material containing a yellow dye by dispensing the absorber material on to the charge coupled device while the latter is spinning at 500 rpm., spreading the absorber material by spinning at 1500 rpm. for 1.5 seconds, continuing the spinning for 25 seconds at 2800 rpm. and then stabilizing the absorber layer by baking on a hot plate at 250° C. for 30 seconds.

A barrier layer formed of Futurrex ICI-200 is deposited on top of the absorber layer by dispensing the barrier material while the charge coupled device is spinning at 500 rpm., spreading the barrier material by spinning at 1500 rpm. for 1.5 seconds, continuing the spinning for 25 seconds at 3000 rpm. and then stabilizing the barrier layer by baking on a hot plate at 200° C. for 30 seconds.

A photoresist layer formed of Hunt 204 positive photoresist is deposited on top of the barrier layer by dispensing the photoresist while the charge coupled device is spinning at 500 rpm., spreading the photoresist by spinning at 1500 rpm. for 1.5 seconds, continuing the spinning for 20 seconds at 4600 rpm. and then stabilizing the photoresist layer by baking on a hot plate at 105° C. for 70 seconds.

Patternwise exposure of the photoresist is effected at 0.38 NA using the mercury g line at 1400 J/m$^2$, and the exposed photoresist is developed with Hunt 429 developer, spraying for 2 seconds at 100 rpm., then for 3 seconds at 70 rpm., stopping the rotation for a dwell time of 14 seconds, rinsing for 10 seconds at 300 rpm., and finally spin drying for 10 seconds at 3000 rpm. The charge coupled device is then hard baked at 105° C. for 60 seconds.

The two reactive ion etching steps are effected using a Plasma Therm "RIESL700" parallel plate reactive ion etcher apparatus. The first set of etching conditions are a sulfur hexafluoride reactive ion etch at an SF$_6$ flow rate of 20 standard cubic centimeters per minute (sccm/minute), a pressure of 20 mTorr and a power of 50 W for 4.0 minutes, while the second set of etching conditions are an oxygen reactive ion etch at an O$_2$ flow rate of 20 sccm/minute, a pressure of 10 Mtorr and a power of 300 W for 10.0 minutes.

After the two reactive ion etching steps, the charge coupled device is provided with a yellow filter on its surface. If desired, additional filter elements of differing colors can be provided by the techniques described above.

It will be apparent to those skilled in the art of producing filters that numerous modifications of, and additions to, the preferred embodiments of the invention described above can be made without departing from the scope of the invention. For example, any one or more of the dye-containing layers could contain more than one dye, or could be a composite of two separate dye layers containing differing dyes, if such a combination were required, for example, to adjust the spectral response of the filter produced. If difficulty is encountered in achieving sufficient adhesion between adjacent layers, additional tie layers may be introduced, provided of course that such layers have characteristics, such as ion etch characteristics, which do not interfere with the process of the invention. Also, if desired, a protective overcoat layer may be placed over the completed filter to protect the filter from mechanical abrasion or environmental damage during use.

We claim:

1. A color filter comprising:
    a plurality of first areas formed of an absorber material comprising a first dye, the absorber material being readily etched by oxygen reactive ion etching, and a barrier layer superposed over the absorber material, the barrier layer comprising a silicon rich species and being resistant to oxygen reactive ion etching but readily etched by fluorine containing plasmas; and
    a plurality of second areas comprising a second dye having absorption characteristics differing from those of the first dye,
    at least one of the second areas overlapping at least one of the first areas to from at least one overlap area in which the first and second dyes are separated by the barrier layer.

2. A filter according to claim 1 wherein the first dye is a yellow dye and the second dye is a cyan dye.

3. A filter according to claim 1 wherein the absorber material also comprises a polymer.

4. A filter according to claim 1 wherein the absorber material is essentially free from metal ions.

5. A filter according to claim 1 wherein the absorber material has a thickness in the range of about 1 to about 5 microns.

6. A filter according to claim 1 wherein the barrier material comprises at least one of a polysilane, a polysiloxane, an organosilicon compound, silica and silicon nitride.

7. A filter according to claim 1 further comprising a substrate, and in which the absorber material in the first areas is in contact with the substrate and the first dye comprises a yellow dye.

8. A filter according to claim 7 wherein the second dye comprises a cyan dye.

9. A solid state imager having at least part of its imaging surface provided with a color filter, said color filter comprising:
    a plurality of first areas formed of an absorber material comprising a first dye, the absorber material being readily etched by oxygen reactive ion etching, and a barrier layer superposed over the absorber material, the barrier layer comprising a silicon rich species and being resistant to oxygen reactive ion etching but readily etched by fluorine containing plasmas; and a plurality of second areas comprising a second dye having absorption characteristics differing from those of the first dye, at least one of the second areas overlapping at least one of the first areas to form at least one overlap area in which the first and second dyes are separated by the barrier layer.

10. A charge-coupled device having at least part of its imaging surface provided with a color filter, said color filter comprising:

a plurality of first area formed of an absorber material comprising a first dye, the absorber material being readily etched by oxygen reactive ion etching, and a barrier layer superposed over the absorber material, the barrier layer comprising a silicon rich species and being resistant to oxygen reactive ion etching but readily etched by fluorine containing plasmas; and a plurality of second areas comprising a second dye having absorption characteristics differing from those of the first dye, at least one of the second areas overlapping at least one of the first areas to form at least one overlap area in which the first and second dyes are separated by the barrier layer.

11. A filter produced by a process comprising:

providing on a substrate a layer of an absorber material comprising a dye material having predetermined absorption and transmission characteristics;

providing a layer of a barrier material superposed on the layer of absorber material, the barrier material being more susceptible to reactive ion etching than the absorber material under a first set of etching conditions, but resistant to reactive ion etching under a second set of etching conditions under which the absorber material is susceptible to etching;

providing a layer of a photoresist material superposed on the layer of barrier material;

patternwise exposing the layer of photoresist material and developing the exposed layer to remove one of the exposed and non-exposed regions thereof, thereby to bare the regions of the barrier layer underlying the removed regions of the photoresist material, the remaining regions of the photoresist material being resistant to reactive ion etching under said first set of etching conditions but susceptible to reactive ion etching under said second set of etching conditions;

reactive ion etching the coated substrate under said first set of etching conditions, thereby etching away the bared regions of the barrier layer and baring selected regions of the absorber layer, but not etching away the remaining regions of the photoresist material nor substantially etching away the bared regions of the absorber layer; and reactive ion etching the coated substrate under said second set of etching conditions, thereby etching away the remaining regions of the photoresist layer and the bared regions of the absorber layer, and thereby forming a filter on the substrate.

12. A filter according to claim 11 wherein the absorber material also comprises a polymer.

13. A filter according to claim 11 wherein the absorber material is essentially free from metal ions.

14. A filter according to claim 11 wherein the absorber layer has a thickness in the range of about 1 to about 5 microns.

15. A filter according to claim 11 wherein the barrier material comprises at least one silicon compound.

16. A filter according to claim 15 wherein the barrier material comprises at least one of a polysilane, a polysiloxane, an organosilicon compound, silica and silicon nitride.

17. A solid state imager having at least part of its imaging surface provided with a color filter, said color filter having been produced by a process comprising:

providing on said imaging surface a layer of an absorber material comprising a dye material having predetermined absorption and transmission characteristics;

providing a layer of a barrier material superposed on the layer of absorber material, the barrier material being more susceptible to reactive ion etching than the absorber material under a first set of etching conditions, but resistant to reactive ion etching under a second set of etching conditions under which the absorber material is susceptible to etching;

providing a layer of a photoresist material superposed on the layer of barrier material;

patternwise exposing the layer of photoresist material and developing the exposed layer to remove one of the exposed and non-exposed regions thereof, thereby to bare the regions of the barrier layer underlying the removed regions of the photoresist material, the remaining regions of the photoresist material being resistant to reactive ion etching under said first set of etching conditions but susceptible to reactive ion etching under said second set of etching conditions;

reactive ion etching the coated imaging surface under said first set of etching conditions, thereby etching away the bared regions of the barrier layer and baring selected regions of the absorber layer, but not etching away the remaining regions of the photoresist material nor substantially etching away the bared regions of the absorber layer; and reactive ion etching the coated substrate under said second set of etching conditions, thereby etching away the remaining regions of the photoresist layer and the bared regions of the absorber layer, and thereby forming a filter on the imaging surface.

18. A charge coupled device having at least part of its imaging surface provided with a color filter, said color filter having been produced by a process comprising:

providing on said imaging surface a layer of an absorber material comprising a dye material having predetermined absorption and transmission characteristics;

providing a layer of a barrier material superposed on the layer of absorber material, the barrier material being more susceptible to reactive ion etching than the absorber material under a first set of etching conditions, but resistant to reactive ion etching under a second set of etching conditions under which the absorber material is susceptible to etching;

providing a layer of a photoresist material superposed on the layer of barrier material;

patternwise exposing the layer of photoresist material and developing the exposed layer to remove one of the exposed and non-exposed regions thereof, thereby to bare the regions of the barrier layer underlying the removed regions of the photoresist material, the remaining regions of the photoresist material being resistant to reactive ion etching under said first set of etching conditions but susceptible to reactive ion etching under said second set of etching conditions;

reactive ion etching the coated imaging surface under said first set of etching conditions, thereby etching away the bared regions of the barrier layer and baring selected regions of the absorber layer, but not etching away the remaining regions of the photoresist material nor substantially etching away the bared regions of the absorber layer; and reactive ion etching the coated substrate under said second set of etching conditions, thereby etching away the remaining regions of the photoresist layer and the bared regions of the absorber layer, and thereby forming a filter on the imaging surface.

19. A solid state imager provided with a two-color filter produced by a process comprising:

providing on the solid state imager a layer of an absorber material containing a yellow dye;

providing a layer of a barrier material superposed on the layer of absorber material, the barrier material being more susceptible to reactive ion etching than the absorber material under a first set of etching conditions, but resistant to reactive ion etching under a second set of etching conditions under which the absorber material is susceptible to etching;

providing a layer of a photoresist material superposed on the layer of barrier material;

patternwise exposing the layer of photoresist material and developing the exposed layer to remove one of the exposed and non-exposed regions thereof, thereby to bare regions of regions of the barrier layer underlying the removed regions of the photoresist material, the remaining regions of the photoresist material being resistant to reactive ion etching under said first set of etching conditions but susceptible to reactive ion etching under said second set of etching conditions;

reactive ion etching the coated solid state imager under said first set of etching conditions, thereby etching away the bared regions of the barrier layer and baring selected regions of the absorber layer, but not etching away the remaining regions of the photoresist material nor substantially etching away the bared regions of the absorber layer;

reactive ion etching the coated solid state imager under said second set of etching conditions, thereby etching away the remaining regions of the photoresist layer and the bared regions of the absorber layer, and thereby forming a filter comprising a plurality of discrete yellow areas on the solid state imager;

providing on the filter a layer of a dye/photoresist composition comprising a positive photoresist and a cyan dye, the cyan dye being soluble in the solvent of the positive photoresist; and patternwise exposing the cyan dye/photoresist layer and developing the exposed layer with a developer for the photoresist to remove the exposed regions of the exposed layer, the cyan dye constituting in excess of 10 percent by weight of the cyan dye/photoresist composition, being substantially non-absorptive in the exposure wavelength of the cyan dye/photoresist composition and possessing substantially the same polarity as the composition, thereby producing a filter having discrete yellow and cyan areas, and areas in which the cyan dye overlies the yellow dye.

20. A solid state imager provided with a three-color filter produced by a process comprising:

a) providing on the solid state imager a layer of an absorber material containing a yellow dye;

b) providing a layer of a barrier material superposed on the layer of absorber material, the barrier material being more susceptible to reactive ion etching than the absorber material under a first set of etching conditions, but resistant to reactive ion etching under a second set of etching conditions under which the absorber material is susceptible to etching;

c) providing a layer of a photoresist material superposed on the layer of barrier material;

d) patternwise exposing the layer of photoresist material and developing the exposed layer to remove one of the exposed and non-exposed regions thereof, thereby to bare regions of regions of the barrier layer underlying the removed regions of the photoresist material, the remaining regions of the photoresist material being resistant to reactive ion etching under said first set of etching conditions but susceptible to reactive ion etching under said second set of etching conditions;

e) reactive ion etching the coated solid state imager under said first set of etching conditions, thereby etching away the bared regions of the barrier layer and baring selected regions parts of the absorber layer, but not etching away the remaining regions of the photoresist material nor substantially etching away the bared regions of the absorber layer;

f) reactive ion etching the coated solid state imager under said second set of etching conditions, thereby etching away the remaining regions of the photoresist layer and the bared regions of the absorber layer, and thereby forming a filter comprising a plurality of discrete yellow areas on the solid state imager;

g) providing on the filter a layer of a dye/photoresist composition comprising a positive photoresist and a second dye, the second dye being one of cyan and magenta in color and soluble in the solvent of the positive photoresist;

h) patternwise exposing the second dye/photoresist layer and developing the exposed layer with a developer for the photoresist to remove the exposed regions of the exposed layer, the second dye constituting in excess of 10 percent by weight of the second dye/photoresist composition, being substantially non-absorptive in the exposure wavelength of the second dye/photoresist composition and possessing substantially the same polarity as the composition;

i) providing on the filter a layer of a dye/photoresist composition comprising a positive photoresist and a third dye, the third dye being the other of cyan and magenta in color and soluble in the solvent of the positive photoresist; and j) exposing predetermined parts of the third dye layer to radiation adapted to increase solubility of the third dye layer in the exposed areas; and k) patternwise exposing the third dye/photoresist layer and developing the exposed layer with a developer for the photoresist to remove the exposed regions of the exposed layer, the third dye constituting in excess of 10 percent by weight of the third dye/photoresist composition, being substantially non-absorptive in the exposure wavelength of the third dye/photoresist composition and possessing substantially the same polarity as the composition, thereby producing a three-color filter having discrete yellow, cyan and magenta areas.

* * * * *